United States Patent
Haneda

(10) Patent No.: US 10,332,927 B2
(45) Date of Patent: Jun. 25, 2019

(54) SEMICONDUCTOR DEVICE, MANUFACTURING METHOD, SOLID STATE IMAGE SENSOR, AND ELECTRONIC EQUIPMENT

(71) Applicant: SONY CORPORATION, Tokyo (JP)

(72) Inventor: Masaki Haneda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/574,207

(22) PCT Filed: May 6, 2016

(86) PCT No.: PCT/JP2016/063630
§ 371 (c)(1),
(2) Date: Nov. 15, 2017

(87) PCT Pub. No.: WO2016/190059
PCT Pub. Date: Dec. 1, 2016

(65) Prior Publication Data
US 2018/0138224 A1    May 17, 2018

(30) Foreign Application Priority Data
May 22, 2015  (JP) ................................ 2015-104705

(51) Int. Cl.
*H01L 27/146* (2006.01)
*H01L 23/00* (2006.01)
(Continued)

(52) U.S. Cl.
CPC .... *H01L 27/14634* (2013.01); *H01L 21/3205* (2013.01); *H01L 21/768* (2013.01);
(Continued)

(58) Field of Classification Search
CPC ....... H01L 2225/06513; H01L 25/0657; H01L 21/8221; H01L 24/81; H01L 24/17;
(Continued)

(56) References Cited

U.S. PATENT DOCUMENTS

| 2013/0009321 A1* | 1/2013 | Kagawa | ............ H01L 21/76807 257/774 |
| 2013/0105924 A1* | 5/2013 | Kobayashi | ........ H01L 27/14632 257/431 |

(Continued)

FOREIGN PATENT DOCUMENTS

| JP | 2013-033900 A | 2/2013 |
| JP | 2013-168419 A | 8/2013 |
| JP | 2015-079901 A | 4/2015 |

OTHER PUBLICATIONS

International Search Report prepared by the Japan Patent Office dated Jun. 21, 2016, for International Application No. PCT/JP2016/063630.

*Primary Examiner* — Caridad Everhart
(74) *Attorney, Agent, or Firm* — Sheridan Ross P.C.

(57) ABSTRACT

The present disclosure relates to a semiconductor device, a manufacturing method, a solid state image sensor, and electronic equipment that can achieve further improvement in reliability. Connection pads are formed in interlayer films provided respectively in interconnection layers of a sensor substrate on which a sensor surface having pixels is formed and a signal processing substrate configured to perform signal processing on the sensor substrate to make an electrical connection between the sensor substrate and the signal processing substrate. Then, a metal oxide film is formed between the interlayer films of the sensor substrate and the signal processing substrate, between the connection pad formed on a side toward the sensor substrate and the interlayer film on a side toward the signal processing sub- (Continued)

strate, and between the connection pad formed on the side toward the signal processing substrate and the interlayer film on the side toward the sensor substrate. The present technology can be applied to a laminated-type CMOS image sensor, for example.

13 Claims, 4 Drawing Sheets

(51) Int. Cl.
    *H01L 21/3205*     (2006.01)
    *H01L 23/522*     (2006.01)
    *H01L 23/532*     (2006.01)
    *H01L 21/768*     (2006.01)
    *H01L 27/14*     (2006.01)

(52) U.S. Cl.
    CPC .......... *H01L 23/522* (2013.01); *H01L 23/532* (2013.01); *H01L 24/08* (2013.01); *H01L 24/89* (2013.01); *H01L 27/14* (2013.01); *H01L 27/1469* (2013.01); *H01L 27/14636* (2013.01); H01L 24/03 (2013.01); H01L 24/05 (2013.01); H01L 2224/0345 (2013.01); H01L 2224/0346 (2013.01); H01L 2224/03616 (2013.01); H01L 2224/05082 (2013.01); H01L 2224/05147 (2013.01); H01L 2224/05181 (2013.01); H01L 2224/05186 (2013.01); H01L 2224/0801 (2013.01); H01L 2224/08121 (2013.01); H01L 2224/08145 (2013.01); H01L 2224/80009 (2013.01); H01L 2224/80895 (2013.01); H01L 2224/80896 (2013.01); H01L 2924/0104 (2013.01); H01L 2924/01012 (2013.01); H01L 2924/01013 (2013.01); H01L 2924/01023 (2013.01); H01L 2924/01025 (2013.01); H01L 2924/05442 (2013.01)

(58) Field of Classification Search
    CPC ............. H01L 24/11; H01L 2224/0401; H01L 2224/13147; H01L 2224/73204; H01L 2224/16227; H01L 2224/80896; H01L 27/14636; H01L 27/1469; H01L 2224/05186; H01L 2224/0801; H01L 24/05; H01L 2924/0104; H01L 27/14601; H01L 27/14634; H01L 27/14643; H01L 24/03; H01L 21/3205; H01L 2224/05082; H01L 2224/05147
    See application file for complete search history.

(56) References Cited

U.S. PATENT DOCUMENTS

| | | | |
|---|---|---|---|
| 2013/0207271 A1* | 8/2013 | Hagimoto | H01L 27/14634 257/770 |
| 2014/0045329 A1* | 2/2014 | Ishizaka | H01L 21/2855 438/643 |
| 2015/0108648 A1* | 4/2015 | Tsumura | H01L 24/05 257/751 |

* cited by examiner

SEMICONDUCTOR DEVICE, MANUFACTURING METHOD, SOLID STATE IMAGE SENSOR, AND ELECTRONIC EQUIPMENT

CROSS REFERENCE TO RELATED APPLICATIONS

This application is a national stage application under 35 U.S.C. 371 and claims the benefit of PCT Application No. PCT/JP2016/063630 having an international filing date of 06 May 2016, which designated the United States, which PCT application claimed the benefit of Japanese Patent Application No. 2015-104705 filed 22 May 2015, the disclosures of which are incorporated herein by reference in their entirety.

TECHNICAL FIELD

The present disclosure relates to a semiconductor device, a manufacturing method, a solid state image sensor, and electronic equipment, and more particularly to a semiconductor device, a manufacturing method, a solid state image sensor, and electronic equipment that can achieve further improvement in reliability.

BACKGROUND ART

Conventionally, a solid state image sensor, such as a charge coupled device (CCD) or a complementary metal oxide semiconductor (CMOS) image sensor, for example, is used in electronic equipment provided with an imaging function, such as a digital still camera or a digital video camera. The solid state image sensor has pixels in which photodiodes that perform photoelectric conversion and a plurality of transistors have been combined, and an image is constructed on the basis of pixel signals output from a plurality of pixels arranged on an image plane on which an image of a subject is produced.

Moreover, in recent years, in order to achieve size reduction and high performance of the solid state image sensor, a laminated-type solid state image sensor has been developed in which, on a sensor substrate on which pixels are formed, a signal processing substrate that performs signal processing on an image signal output from the sensor substrate has been laminated. In such a laminated-type solid state image sensor, composite bonding, such as physically connecting bonding surfaces of wafers and electrically connecting connection pads formed on the bonding surfaces is performed.

For example, Patent Literature 1 discloses a semiconductor device in which, by forming metal films entirely on bonding surfaces of two semiconductor substrates and performing a heating treatment in a state where the metal films are in contact with each other, portions of the metal films in contact with an interlayer insulation layer react to form an insulation film.

CITATION LIST

Patent Literature

Patent Literature 1: JP 2013-168419A

DISCLOSURE OF INVENTION

Technical Problem

Meanwhile, conventionally, a misalignment may occur when bonding wafers, which results in a structure in which part of a connection pad (Cu) of one of the wafers has been bonded to an insulation layer (SiO2) of the other wafer. In such a structure, barrier metal will not be provided at the interface between the connection pad and the insulation layer. This raises a concern that copper constituting the connection pad is diffused from the interface between the connection pad and the insulation layer into the insulation layer in a later process of applying heat (such as post bond anneal or ILD depo, for example) to cause leakage.

In addition, a low adhesion strength between the connection pad (Cu) and the insulation layer (SiO2) raises a concern for a reduction in the overall bonding strength (wafer bonding strength). Thus, a resistance to Electro Migration, a resistance to Stress Induced Voiding, and the like are reduced, which causes a reduction in reliability as a whole.

The present disclosure was made in view of these circumstances, and can achieve further improvement in reliability.

Solution to Problem

A semiconductor device of an aspect of the present disclosure includes: connection pads formed in interlayer films provided respectively in interconnection layers of a first semiconductor substrate and a second semiconductor substrate to make an electrical connection between the first semiconductor substrate and the second semiconductor substrate; and a metal oxide film formed between the interlayer films of the first semiconductor substrate and the second semiconductor substrate, between the connection pad formed on a side toward the first semiconductor substrate and the interlayer film on a side toward the second semiconductor substrate, and between the connection pad formed on the side toward the second semiconductor substrate and the interlayer film on the side toward the first semiconductor substrate.

In a method of manufacturing a semiconductor device of an aspect of the present disclosure, the semiconductor device includes connection pads formed in interlayer films provided respectively in interconnection layers of a first semiconductor substrate and a second semiconductor substrate to make an electrical connection between the first semiconductor substrate and the second semiconductor substrate, and a metal oxide film formed between the interlayer films of the first semiconductor substrate and the second semiconductor substrate, between the connection pad formed on a side toward the first semiconductor substrate and the interlayer film on a side toward the second semiconductor substrate, and between the connection pad formed on the side toward the second semiconductor substrate and the interlayer film on the side toward the first semiconductor substrate. The method includes the steps of: forming a metal film on at least one bonding surface of a bonding surface including the interlayer film on the side toward the first semiconductor substrate and the connection pad formed in the interlayer film and a bonding surface including the interlayer film on the side toward the second semiconductor substrate and the connection pad formed in the interlayer film; and by applying a heat treatment in a state where the first semiconductor substrate and the second semiconductor substrate are in close contact with each other with the metal film interposed between the first semiconductor substrate and the second semiconductor substrate, spontaneously forming the metal oxide film resulting from a reaction between the metal film and the interlayer films.

A solid state image sensor of an aspect of the present disclosure includes: connection pads formed in interlayer films provided respectively in interconnection layers of a sensor substrate on which a sensor surface having pixels is formed and a signal processing substrate configured to perform signal processing on the sensor substrate to make an electrical connection between the sensor substrate and the signal processing substrate; and a metal oxide film formed between the interlayer films of the sensor substrate and the signal processing substrate, between the connection pad formed on a side toward the sensor substrate and the interlayer film on a side toward the signal processing substrate, and between the connection pad formed on the side toward the signal processing substrate and the interlayer film on the side toward the sensor substrate.

Electronic equipment of an aspect of the present disclosure includes: a solid state image sensor including connection pads formed in interlayer films provided respectively in interconnection layers of a sensor substrate on which a sensor surface having pixels is formed and a signal processing substrate configured to perform signal processing on the sensor substrate to make an electrical connection between the sensor substrate and the signal processing substrate, and a metal oxide film formed between the interlayer films of the sensor substrate and the signal processing substrate, between the connection pad formed on a side toward the sensor substrate and the interlayer film on a side toward the signal processing substrate, and between the connection pad formed on the side toward the signal processing substrate and the interlayer film on the side toward the sensor substrate.

In an aspect of the present disclosure, connection pads are formed in interlayer films provided respectively in interconnection layers of a first semiconductor substrate (sensor substrate) and a second semiconductor substrate (signal processing substrate) to make an electrical connection between the first semiconductor substrate and the second semiconductor substrate. In addition, a metal oxide film is formed between the interlayer films of the first semiconductor substrate and the second semiconductor substrate, between the connection pad formed on a side toward the first semiconductor substrate and the interlayer film on a side toward the second semiconductor substrate, and between the connection pad formed on the side toward the second semiconductor substrate and the interlayer film on the side toward the first semiconductor substrate.

Advantageous Effects of Invention

According to an aspect of the present disclosure, it is possible to achieve further improvement in reliability.

MODE(S) FOR CARRYING OUT THE INVENTION

Hereinafter, a specific embodiment to which the present technology has been applied will be described in detail with reference to the drawings.

Figure 1:
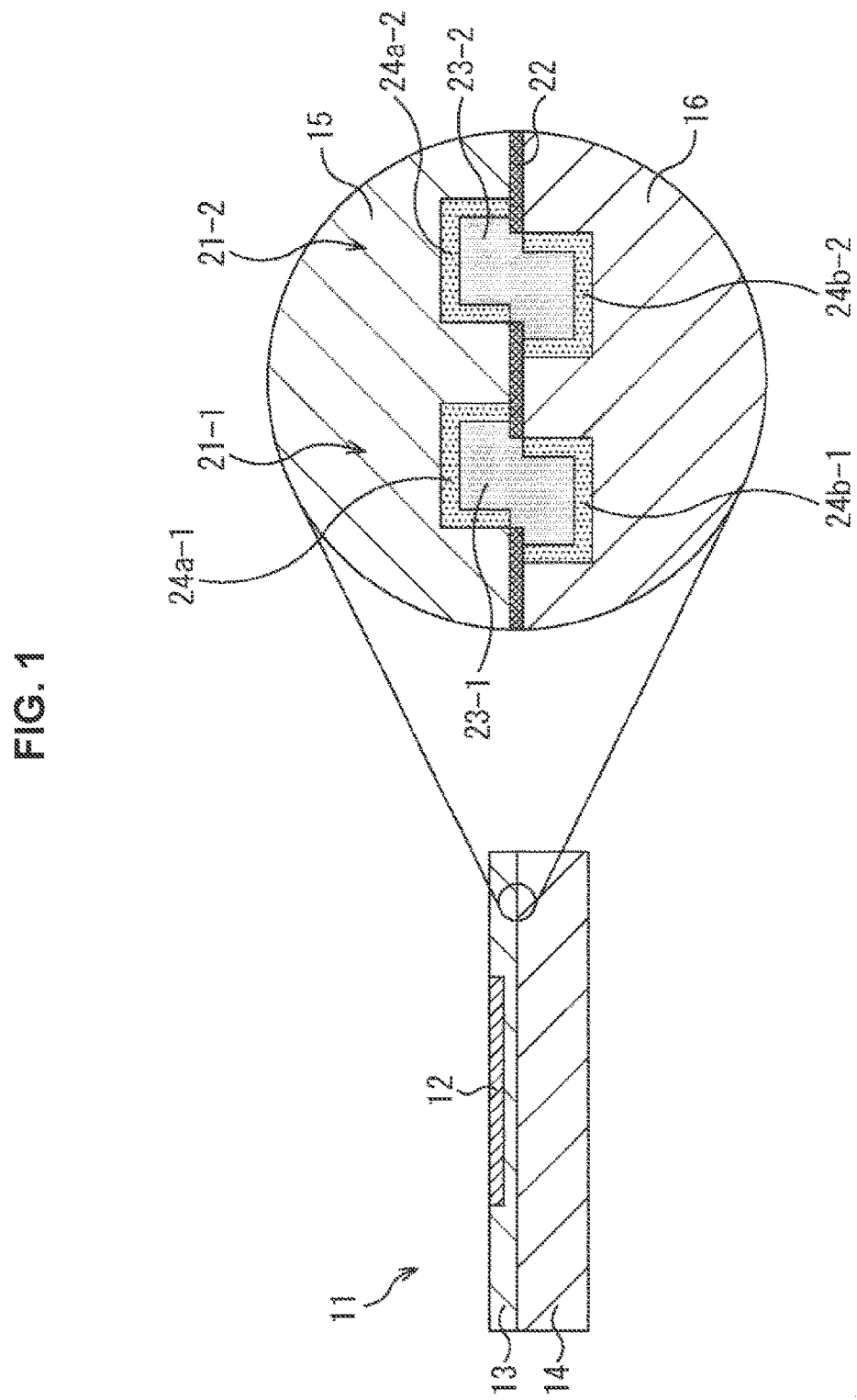
FIG. 1 is an illustration showing a configuration example of an embodiment of a solid state image sensor to which the present technology has been applied.

FIG. 1 is an illustration showing a configuration example of an embodiment of a solid state image sensor which is a semiconductor device to which the present technology has been applied.

In FIG. 1, a sectional configuration example of a solid state image sensor 11 and an enlarged portion thereof are shown.

As shown in FIG. 1, the solid state image sensor 11 is configured by laminating a sensor substrate 13 on which a sensor surface 12 arranged on an image plane on which an image of a subject is produced by an optical system not shown is formed and a signal processing substrate 14 attached in a manner as to support the sensor substrate 13.

In the sensor surface 12, photodiodes which are photoelectric changing units that receive light for conversion into electric charges are arranged in a matrix form, and imaging is performed when their pixels receive light.

The sensor substrate 13 is configured by laminating, for example, a silicon layer in which photodiodes, transistors, and the like constituting pixels are formed and an interconnection layer in which interconnect lines to be connected to pixels are formed, and outputs an image signal of an image imaged on the sensor surface 12. For example, the interconnection layer is configured by forming a metal interconnect line having conductivity within an interlayer film 15 made of silicon dioxide ($SiO_2$).

The signal processing substrate 14 carries out various types of signal processing on an image signal output from the sensor substrate 13, and then, outputs the image signal to a later-stage image processing circuit. Moreover, the signal processing substrate 14 is provided with an interconnection layer in which an interconnect line for capturing the image signal output from the sensor substrate 13 is formed, and that interconnection layer is provided with an interlayer film 16 similarly to the interlayer film 15 of the sensor substrate 13.

In this manner, the solid state image sensor 11 is configured by laminating the sensor substrate 13 and the signal processing substrate 14, and the sensor substrate 13 and the signal processing substrate 14 are bonded physically and electrically. For example, on the right side of FIG. 1, a sectional configuration example in the vicinity of two bonding terminal portions 21-1 and 21-2 that make an electrical connection between the sensor substrate 13 and the signal processing substrate 14 is shown in an enlarged manner.

In the bonding surface between the sensor substrate 13 and the signal processing substrate 14, a metal oxide film 22 is formed on the entire surface except for the positions where the bonding terminal portions 21-1 and 21-2 are formed.

Moreover, in the bonding terminal portion 21-1, a connection pad 23-1 is formed in which a connection pad formed on the side toward the interlayer film 15 of the sensor substrate 13 and a connection pad formed on the side toward the interlayer film 16 of the signal processing substrate 14 have been bonded to be integral, and an electrical connection is made. The connection pad 23-1 is covered by a barrier metal 24a-1 on the side toward the interlayer film 15, and the connection pad 23-1 is covered by a barrier metal 24b-1 on the side toward the interlayer film 16. Similarly, as to a connection pad 23-2 formed in the bonding terminal portion 21-2, the connection pad 23-2 is covered by a barrier metal 24a-2 on the side toward the interlayer film 15, and the connection pad 23-2 is covered by a barrier metal 24b-2 on the side toward the interlayer film 16.

Note that the bonding terminal portions 21-1 and 21-2 are configured similarly, and hereinafter, as necessary, in a case where it is not necessary to distinguish between the bonding terminal portions 21-1 and 21-2, they will simply be referred to as a bonding terminal portion 21. Similarly, the connection pads 23-1 and 23-1 will be referred to as a connection pad 23, the barrier metals 24a-1 and 24a-2 will be referred to as a barrier metal 24a, and the barrier metals 24b-1 and 24b-2 will be referred to as a barrier metal 24b.

Here, when bonding the sensor substrate 13 and the signal processing substrate 14, an adjustment for aligning the connection pad formed in the interlayer film 15 of the sensor substrate 13 and the connection pad formed in the interlayer film 16 of the signal processing substrate 14 is performed. If it is possible to fully match them in position at that time, the connection pad 23 can be covered by the barrier metals 24a and 24b. However, a slight misalignment actually occurs. Therefore, as shown in FIG. 1, the connection pad 23 is formed into a shape in which portions on the side toward the interlayer film 15 and on the side toward the interlayer film 16 are misaligned.

The solid state image sensor 11 is configured such that, even if such a misalignment occurs, the connection pad 23 will not be brought into direct contact with the interlayer films 15 and 16 by forming the metal oxide film 22. That is, in the solid state image sensor 11, the metal oxide film 22 is formed between the interlayer film 15 of the sensor substrate 13 and the interlayer film 16 of the signal processing substrate 14, between the connection pad 23 formed on the side toward the sensor substrate 13 and the interlayer film 16 of the signal processing substrate 14, and between the connection pad 23 formed on the side toward the signal processing substrate 14 and the interlayer film 15 of the sensor substrate 13.

Due to the fact that the metal oxide film 22 formed in this manner functions as a diffusion barrier, it is possible to prevent copper constituting the connection pad 23 from diffusing into the interlayer film 15 or 16, and to suppress an occurrence of leakage (a short circuit between interconnect lines).

Moreover, it is known that an adhesion strength between copper constituting the connection pad 23 and SiO2 constituting the interlayer films 15 and 16 is low. In this respect, in the solid state image sensor 11, it is possible to spontaneously form the metal oxide film 22 at the interface between the connection pad 23 and the interlayer films 15 and 16 as will be described later with reference to FIG. 2, and thus, an adhesion strength can be ensured. Accordingly, the solid state image sensor 11 can have a higher resistance to electromigration and a higher resistance to stress migration, and it is possible to attain more improved reliability than conventional.

Next, a step of bonding the sensor substrate 13 and the signal processing substrate 14 in a method of manufacturing the solid state image sensor 11 will be described with reference to FIG. 2.

First, before the step of bonding the sensor substrate 13 and the signal processing substrate 14 is performed, the connection pads 23a and 23b are formed in the sensor substrate 13 and the signal processing substrate 14, respectively, through a damascene process.

Here, a step of forming the connection pad 23a in the interlayer film 15 of the sensor substrate 13 will be described. First, an interconnect line trench is formed in silicon dioxide (SiO2) to serve as the interlayer film 15 or an equivalent insulation film by lithography and dry etching, and the barrier metal 24a to serve as a diffusion barrier between the connection pad 23a and the interlayer film 15 is formed in that interconnect line trench. The barrier metal 24a can be formed by subjecting tantalum (Ta) to physical vapor deposition (PVD), for example.

Thereafter, a copper (copper alloy) seed layer to serve as an electrode in a plating process in a post process is formed by physical vapor deposition, for example, and then, copper is charged through the plating process, and excess copper is removed by chemical mechanical polishing (CMP) to fill the interconnect line trench with copper. By such a step, the connection pad 23a is formed. In addition, the connection pad 23b is formed in the interlayer film 16 of the signal processing substrate 14 by a similar step with the barrier metal 24b serving as a diffusion barrier.

Then, a metal film 31a is formed on the entire surface of the interlayer film 15 and the connection pad 23a. Similarly, a metal film 31b is formed on the entire surface of the interlayer film 16 and the connection pad 23b. At this time, the metal films 31a and 31b contain at least one or more elements among manganese (Mn), vanadium (V), aluminum (Al), magnesium (Mg), and zirconium (Zr), and is configured by depositing them with a thickness of about 0.1 to 10 nm.

As a metal employed as such metal films 31a and 31b, a metal having a property of reacting with SiO2 constituting the interlayer films 15 and 16 in a later heat treatment to produce an oxide is selected, for example. Accordingly, it is possible to suppress leakage that would occur between the connection pads 23. That is, it is desirable to use an oxide that has an insulation property that functions as a barrier for preventing copper diffusion and a property that is melted into copper constituting the connection pads 23 (which does not interfere with conduction of the interface of the connection pads 23).

Figure 2:
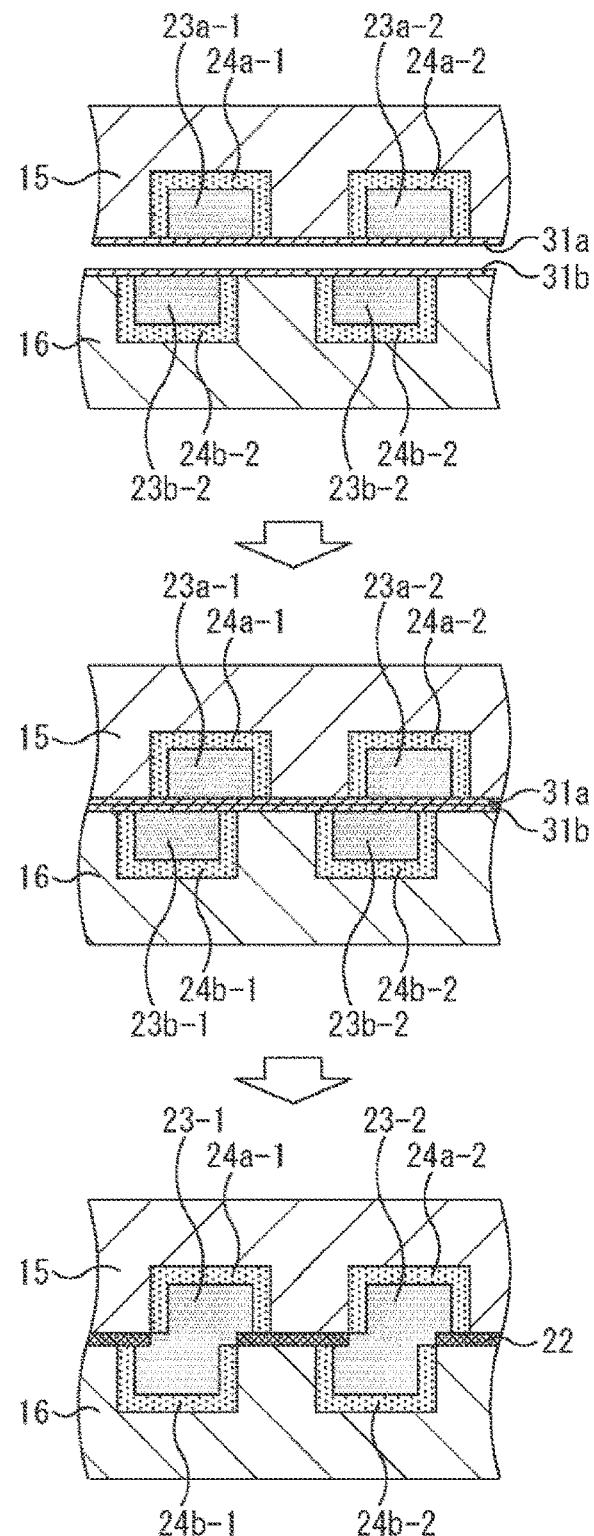
FIG. 2 is an illustration describing a method of manufacturing a solid state image sensor.

Accordingly, in the sensor substrate 13, the metal film 31a is formed on the entire surface of the interlayer film 15 and the connection pad 23a, and in the signal processing substrate 14, the metal film 31b is formed on the entire surface of the interlayer film 16 and the connection pad 23b, as shown at the top of FIG. 2. Then, with the metal film 31a of the sensor substrate 13 and the metal film 31b of the signal processing substrate 14 facing each other, alignment is adjusted such that the connection pads 23a and 23b match in position.

Then, as shown in the middle of FIG. 2, a step of bringing the entire surface of the metal film 31a of the sensor substrate 13 and the entire surface of the metal film 31b of the signal processing substrate 14 into close contact and bonding them such that there are no regions provided where they are unbonded to each other is performed. At this time, bonding is performed with the metal film 31 formed on the entire surface of either one of the bonding surface of the sensor substrate 13 and the bonding surface of the signal processing substrate 14, for example. Note that it is preferable to subject the metal film 31a and the metal film 31b to a pretreatment through use of liquid or gas containing hydrogen before this step is performed, in order to improve the bonding strength by hydrogen bonding.

Thereafter, a step of applying a heat load of 400 degrees or below is performed, for example, with the sensor substrate 13 and the signal processing substrate 14 remaining in close contact.

Accordingly, as shown at the bottom of FIG. 2, the metal films 31a and 31b are melted into copper constituting the connection pads 23a and 23b, and the metal oxide film 22 resulting from a reaction between the metal and an oxide film is formed spontaneously. That is, as the final structure, the metal oxide film 22 is formed between the connection pad 23 and the interlayer films 15 and 16, the connection pads 23a and 23b are integrated, and the metal film 31 does not exist at their interface. Note that it is generally known that many metals easily undergo oxidation, whilst in a case of using a metal to serve as a conventional diffusion barrier (tantalum, for example) for the metal films 31a and 31b, the diffusion barrier function of tantalum will be lost through oxidation, and therefore, element selection is important.

Through the steps as described above, the sensor substrate 13 and the signal processing substrate 14 are bonded physically and electrically.

The solid state image sensor 11 manufactured by such a manufacturing method can suppress an occurrence of leakage between the connection pads 23 (a short circuit between interconnect lines) due to the fact that the metal oxide film 22 functions as a diffusion barrier. Moreover, since the adhesion strength can be ensured by spontaneously forming the metal oxide film 22, it is possible to achieve further improvement in reliability.

Furthermore, the solid state image sensor 11 can obtain a favorable conduction property since the metal film 31 does not exist at the interface between the connection pads 23a and 23b as described above. In a case of using a metal element (titanium, for example) that causes the metal film 31 to remain at the interface between the connection pads 23a and 23b even after the heat treatment, for example, a resistance value will be increased. In contrast to this, in the solid state image sensor 11, it is possible to avoid such an increase in resistance value. Note that the element constituting the metal film 31 having been present between the connection pads 23a and 23b is detected in the connection pad 23.

In addition, the solid state image sensor 11 can favorably suppress an occurrence of leakage by making the metal films 31a and 31b have a thickness of about 0.1 to 10 nm to form the metal oxide film 22 thin.

Note that, as described with reference to FIG. 2, it is not necessary to form the metal film 31 on both of the interlayer film 15 of the sensor substrate 13 and the interlayer film 16 of the signal processing substrate 14, but the metal film 31 should only be formed on at least one of them, and it should only be configured that the metal oxide film 22 is formed reliably.

Further, as an element that can be used for the metal film 31, nickel (Ni), cobalt (Co), iron (Fe), zinc (Zn), or silver (Ag) can be used besides those described above. Although the Patent Literature 1, for example, discloses a configuration example in which titanium (Ti) is used for a metal film, titanium may easily undergo oxidation, and at the same time, is likely to form a passive state in which reactivity exhibited in a normal state has been lost, and therefore, a state in which the entire thin film cannot be oxidized will occur. It is not appropriate to use such a metal that is likely to form a passive state for the metal film 31 of the solid state image sensor 11, but it is suitable to use a metal that does not form a passive state, such as manganese, for the metal film 31 of the solid state image sensor 11.

Note that the present technology can be applied to various laminated-type semiconductor devices (a memory, for example) configured by bonding wafers, for example, besides the solid state image sensor 11 as described above.

Note that the solid state image sensor 11 of each embodiment as described above can be applied to various types of electronic equipment, such as an imaging system, such as a digital still camera or a digital video camera, a mobile phone having an imaging function, or other equipment having an imaging function, for example.

Figure 3:
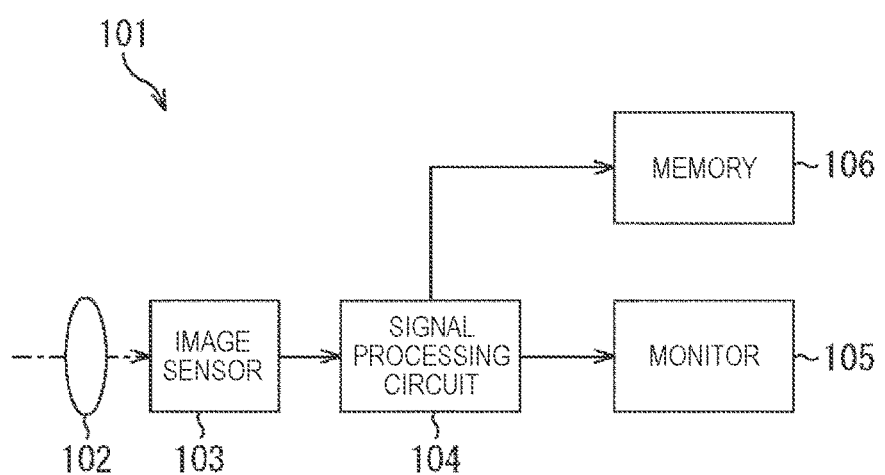
FIG. 3 is a block diagram showing a configuration example of an imaging device mounted on electronic equipment.

FIG. 3 is a block diagram showing a configuration example of an imaging device mounted on electronic equipment.

As shown in FIG. 3, an imaging device 101 includes an optical system 102, an image sensor 103, a signal processing circuit 104, a monitor 105, and a memory 106, and is capable of capturing a still image and a moving image.

The optical system 102 has one or a plurality of lenses, and guides image light (incident light) from a subject to the image sensor 103 to produce an image on a light receiving surface (sensor portion) of the image sensor 103.

As the image sensor 103, the solid state image sensor 11 of the above-described embodiment is applied. In the image sensor 103, electrons are accumulated for a certain period of time in accordance with an image produced on the light receiving surface via the optical system 102. Then, a signal in accordance with electrons accumulated in the image sensor 103 is supplied to the signal processing circuit 104.

The signal processing circuit 104 carries out various types of signal processing on a pixel signal output from the image sensor 103. An image (image data) obtained by the signal processing circuit 104 carrying out signal processing is supplied to the monitor 105 for display, or supplied to the memory 106 for storage (recording).

The imaging device 101 configured in this manner can improve durability more and can perform imaging reliably, for example, by applying the solid state image sensor 11 of the above-described embodiment.

Figure 4:
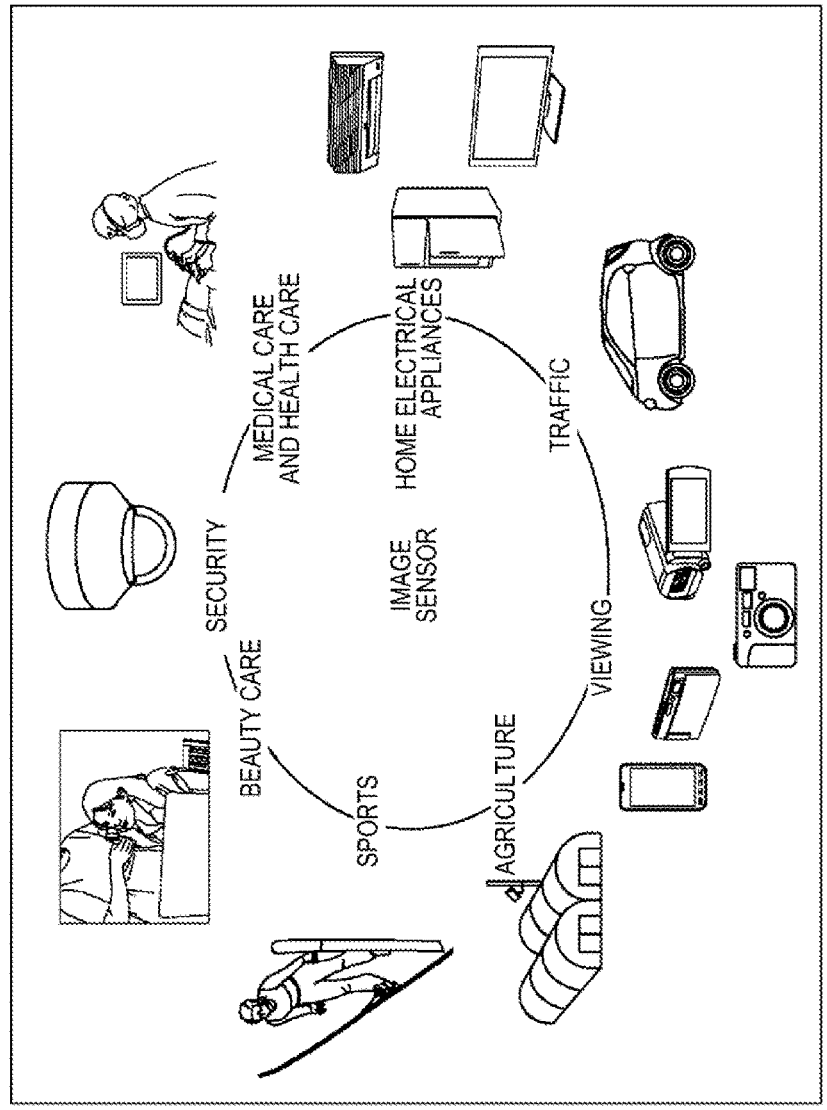
FIG. 4 is an illustration showing a usage example in which an image sensor is used.

FIG. 4 is an illustration showing a usage example in which the above-described solid state image sensor 11 (image sensor) is used.

The above-described image sensor can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Additionally, the present technology may also be configured as below.

(1)
A semiconductor device including:
connection pads formed in interlayer films provided respectively in interconnection layers of a first semiconductor substrate and a second semiconductor substrate to make an electrical connection between the first semiconductor substrate and the second semiconductor substrate; and
a metal oxide film formed between the interlayer films of the first semiconductor substrate and the second semiconductor substrate, between the connection pad formed on a side toward the first semiconductor substrate and the interlayer film on a side toward the second semiconductor substrate, and between the connection pad formed on the side toward the second semiconductor substrate and the interlayer film on the side toward the first semiconductor substrate.

(2)
The semiconductor device according to (1), in which
a metal film is formed on at least one bonding surface of a bonding surface including the interlayer film on the side toward the first semiconductor substrate and the connection pad formed in the interlayer film and a bonding surface including the interlayer film on the side toward the second semiconductor substrate and the connection pad formed in the interlayer film, and
by applying a heat treatment in a state where the first semiconductor substrate and the second semiconductor substrate are in close contact with each other with the metal film interposed between the first semiconductor substrate and the second semiconductor substrate, the metal oxide film resulting from a reaction between the metal film and the interlayer films is formed spontaneously.

(3)
The semiconductor device according to (2), in which
the metal film is composed of a metal having a property in which, in the heat treatment, a portion interposed between the connection pad formed on the side toward the first semiconductor substrate and the connection pad formed on the side toward the second semiconductor substrate is melted into the connection pads.

(4)
The semiconductor device according to (2) or (3), in which
the metal film is composed of a metal having a property of reacting with the interlayer films in the heat treatment to form an oxide having an insulation property.

(5)
The semiconductor device according to any one of (2) to (4), in which
the metal film contains at least one or more elements among manganese, vanadium, aluminum, magnesium, and zirconium.

(6)
The semiconductor device according to any one of (2) to (5), in which
the metal film is formed so as to have a thickness ranging from 0.1 nm to 10 nm.

(7)
The semiconductor device according to any one of (2) to (6), in which
a pretreatment through use of liquid or gas containing hydrogen is performed on the metal film in a state where the metal film has been formed on the entire surface of the interlayer films and the connection pads.

(8)
The semiconductor device according to any one of (2) to (7), in which
when bonding the first semiconductor substrate and the second semiconductor substrate, bonding is performed in a state where the metal film has been formed on the entire surface of at least one of the bonding surfaces.

(9)
A method of manufacturing a semiconductor device, in which
the semiconductor device includes
connection pads formed in interlayer films provided respectively in interconnection layers of a first semiconductor substrate and a second semiconductor substrate to make an electrical connection between the first semiconductor substrate and the second semiconductor substrate, and
a metal oxide film formed between the interlayer films of the first semiconductor substrate and the second semiconductor substrate, between the connection pad formed on a side toward the first semiconductor substrate and the interlayer film on a side toward the second semiconductor substrate, and between the connection pad formed on the side toward the second semiconductor substrate and the interlayer film on the side toward the first semiconductor substrate,
the method including the steps of:
forming a metal film on at least one bonding surface of a bonding surface including the interlayer film on the side toward the first semiconductor substrate and the connection pad formed in the interlayer film and a bonding surface including the interlayer film on the side toward the second semiconductor substrate and the connection pad formed in the interlayer film; and
by applying a heat treatment in a state where the first semiconductor substrate and the second semiconductor substrate are in close contact with each other with the metal film interposed between the first semiconductor substrate and the second semiconductor substrate, spontaneously forming the metal oxide film resulting from a reaction between the metal film and the interlayer films.

(10)
A solid state image sensor including:
connection pads formed in interlayer films provided respectively in interconnection layers of a sensor substrate on which a sensor surface having pixels is formed and a signal processing substrate configured to perform signal processing on the sensor substrate to make an electrical connection between the sensor substrate and the signal processing substrate; and
a metal oxide film formed between the interlayer films of the sensor substrate and the signal processing substrate, between the connection pad formed on a side toward the sensor substrate and the interlayer film on a side toward the signal processing substrate, and between the connection pad formed on the side toward the signal processing substrate and the interlayer film on the side toward the sensor substrate.

(11)
Electronic equipment including:
a solid state image sensor including
connection pads formed in interlayer films provided respectively in interconnection layers of a sensor substrate on which a sensor surface having pixels is formed and a signal processing substrate configured to perform signal processing on the sensor substrate to make an electrical connection between the sensor substrate and the signal processing substrate, and
a metal oxide film formed between the interlayer films of the sensor substrate and the signal processing substrate, between the connection pad formed on a side toward the sensor substrate and the interlayer film on a side toward the signal processing substrate, and between the connection pad formed on the side toward the signal processing substrate and the interlayer film on the side toward the sensor substrate.

In addition, embodiments of the present disclosure are not limited to the above-described embodiments, and various alterations may occur insofar as they are within the scope of the present disclosure.

REFERENCE SIGNS LIST 11 solid state image sensor
12 sensor surface
13 sensor substrate
14 signal processing substrate
15, 16 interlayer film
21 bonding terminal portion
22 metal oxide film
23 connection pad
24 barrier metal
31 metal film

The invention claimed is:

1. An imaging device, comprising:
a sensor substrate including a photodiode, a transistor, and a first wiring layer; and
a circuit substrate including a signal processing circuit and a second wiring layers,
wherein the sensor substrate is stacked on the circuit substrate,
wherein the first wiring layer includes a first connection pad and a first insulating film, the second wiring layer includes a second connection pad and a second insulating film, and the first connection pad and the second connection pad are disposed in a peripheral region other than a pixel region that includes the photodiode,
wherein a metal oxide film is disposed between a first portion of the first insulating film and a first portion of the second insulating film,
wherein a first portion of the first connection pad contacts a first portion of the second connection pad,
wherein the first portion of the first insulating film contacts a first point on a first surface of the metal oxide film,
wherein the first portion of the second insulating film contacts a second point on a second surface of the metal oxide film, the second surface being opposite the first surface, and
wherein the first point of the metal oxide film is aligned with the second point of the metal oxide film.

2. The imaging device according to claim 1, wherein the metal oxide film is an insulating film.

3. The imaging device according to claim 1, wherein the metal oxide film has a thickness from 0.1 nm to 10 nm.

4. The imaging device according to claim 1, wherein the first wiring layer includes a third connection pad, the second wiring layer includes a fourth connection pad, and the third connection pad and the fourth connection pad are disposed in the peripheral region, and
wherein a first portion of the third connection pad contacts a first portion of the fourth connection pad.

5. The imaging device according to claim 1, further comprising:
a first barrier metal layer, wherein a second portion of the second connection pad contacts a first portion of the first barrier metal layer, and the first barrier metal layer covers the first connection pad.

6. The imaging device according to claim 5, wherein a third portion of the second connection pad contacts the metal oxide film.

7. The imaging device according to claim 6, further comprising:
a second barrier metal layer, wherein a second portion of the metal oxide film contacts a first portion of the second barrier metal layer, and the second barrier metal layer covers the second connection pad.

8. The imaging device according to claim 7, wherein a third portion of the metal oxide film contacts a second portion of the first insulating film and a second portion of the second insulating film.

9. The imaging device according to claim 1, wherein the metal oxide film includes at least one of Mn, V, Al, Mg, or Zr.

10. The imaging device according to claim 1, further comprising:
a first barrier metal layer disposed around three sides of the first connection pad in a cross-sectional view;
a second barrier metal layer disposed around three sides of the second connection pad in the cross-sectional view.

11. The imaging device of claim 10, the first connection pad and the second connection pad are offset from one another such that, in the cross-sectional view, i) the metal oxide film is between a first part of the first barrier metal layer and the second insulating film, ii) the metal oxide film is between a first part of the second barrier metal layer and the first insulating film, iii) a second part of the first barrier metal layer contacts the second connection pad, and iv) a second part of the second barrier metal layer contacts the first connection pad.

12. The imaging device of claim 11, wherein the first part and the second part of the first barrier metal layer are surfaces of the first barrier metal layer located at an interface between the sensor substrate and the circuit substrate, and wherein the first part and second part of the second barrier metal layer are surfaces of the second barrier metal layer located at the interface.

13. An electronic device, comprising:
a signal processing circuit; and
an imaging device including:
a sensor substrate including a photodiode, a transistor, and a first wiring layer; and
a circuit substrate including a signal processing circuit and a second wiring layer,
wherein the sensor substrate is stacked on the circuit substrate,
wherein the first wiring layer includes a first connection pad and a first insulating film, the second wiring layer includes a second connection pad and a second insulating film, and the first connection pad and the second connection pad are disposed in a peripheral region other than a pixel region that includes the photodiode,
wherein a metal oxide film is disposed between a first portion of the first insulating film and a first portion of the second insulating film,
wherein a first portion of the first connection pad contacts a first portion of the second connection pad,
wherein the first portion of the first insulating film contacts a first point on a first surface of the metal oxide film, wherein the first portion of the second insulating film contacts a second point on a second surface of the metal oxide film, the second surface being opposite the first surface, and wherein the first point of the metal oxide film is aligned with the second point of the metal oxide film.

* * * * *